United States Patent
Rios et al.

(10) Patent No.: US 10,659,046 B2
(45) Date of Patent: May 19, 2020

(54) LOCAL CELL-LEVEL POWER GATING SWITCH

(71) Applicant: Intel Corporation, Santa Clara, CA (US)

(72) Inventors: Rafael Rios, Austin, TX (US); Van Le, Beaverton, OR (US); Gilbert Dewey, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,021

(22) PCT Filed: Sep. 25, 2015

(86) PCT No.: PCT/US2015/052490
§ 371 (c)(1),
(2) Date: Feb. 23, 2018

(87) PCT Pub. No.: WO2017/052657
PCT Pub. Date: Mar. 30, 2017

(65) Prior Publication Data
US 2018/0254778 A1 Sep. 6, 2018

(51) Int. Cl.
*H03K 19/00* (2006.01)
*G06F 30/30* (2020.01)
(Continued)

(52) U.S. Cl.
CPC ....... *H03K 19/0016* (2013.01); *G06F 1/3203* (2013.01); *G06F 30/30* (2020.01);
(Continued)

(58) Field of Classification Search
CPC ............ H03K 19/0016; H03K 19/094; H03K 19/0008; H03K 19/0013; H01L 27/0207;
(Continued)

(56) References Cited

U.S. PATENT DOCUMENTS 7,098,689 B1 * 8/2006 Tuan ................. H03K 19/17784
326/40
7,125,886 B2 * 10/2006 Zhang .................. C07D 403/06
514/292

(Continued)

OTHER PUBLICATIONS

International Search Report and Written Opinion for International Patent Application No. PCT/US2015/052490 dated May 31, 2016, 15 pgs.
(Continued)

*Primary Examiner* — Don P Le
(74) *Attorney, Agent, or Firm* — Schwabe, Williamson & Wyatt, P.C.

(57) ABSTRACT

A power gating switch is described at a local cell level of an integrated circuit die. In one example a plurality of logic cells have a data input line and a data output line and a power supply input to receive power to drive circuits of the logic cell. A power switch for each logic cell is coupled between a power supply and the power supply input of the respective logic cell to control power being connected from the power supply to the respective logic cell.

15 Claims, 4 Drawing Sheets

(51) Int. Cl.
  *G06F 30/39* (2020.01)
  *G06F 1/3203* (2019.01)
  *H01L 27/02* (2006.01)
  *H03K 19/094* (2006.01)

(52) U.S. Cl.
  CPC .......... *G06F 30/39* (2020.01); *H01L 27/0207* (2013.01); *H03K 19/0008* (2013.01); *H03K 19/0013* (2013.01); *H03K 19/094* (2013.01)

(58) Field of Classification Search
  CPC . G06F 17/5045; G06F 1/3203; G06F 17/5068
  USPC ...................................................... 326/38–41
  See application file for complete search history.

(56) References Cited

U.S. PATENT DOCUMENTS

| | | | | |
|---|---|---|---|---|
| 7,355,440 | B1* | 4/2008 | Santurkar | H03K 19/0016 326/38 |
| 7,504,854 | B1* | 3/2009 | Look | G11C 5/14 326/38 |
| 7,545,177 | B1* | 6/2009 | Kao | H03K 19/0016 326/38 |
| 7,571,413 | B1* | 8/2009 | Ghosh Dastidar | G01R 31/318516 326/37 |
| 2005/0200382 | A1 | 9/2005 | Drenth et al. | |
| 2005/0276132 | A1 | 12/2005 | Severson et al. | |
| 2006/0114025 | A1* | 6/2006 | Frenkil | G06F 17/5031 326/81 |
| 2006/0119382 | A1* | 6/2006 | Shumarayev | G06F 17/5054 326/33 |
| 2006/0261855 | A1 | 11/2006 | Hillman et al. | |
| 2010/0156457 | A1* | 6/2010 | Greene | H03K 19/17784 326/39 |
| 2010/0171523 | A1 | 7/2010 | Yamashita | |
| 2013/0021060 | A1* | 1/2013 | Or-Bach | H03K 17/687 326/41 |
| 2014/0183525 | A1 | 7/2014 | Kaneko et al. | |
| 2014/0239438 | A1* | 8/2014 | Kilger | H01L 21/82 257/528 |
| 2015/0138905 | A1* | 5/2015 | Jayapal | H03K 19/003 365/227 |
| 2016/0155852 | A1* | 6/2016 | Yamazaki | H01L 29/7869 257/43 |

OTHER PUBLICATIONS

International Preliminary Search Report for International Patent Application No. PCT/US2015/052490 dated Apr. 5, 2018, 10 pages.

* cited by examiner

LOCAL CELL-LEVEL POWER GATING SWITCH

CROSS-REFERENCE TO RELATED APPLICATION

This patent application is a U.S. National Phase Application under 35 U.S.C. § 371 of International Application No. PCT/US2015/052490, filed Sep. 25, 2015, entitled "LOCAL CELL-LEVEL POWER GATING SWITCH," which designates the United States of America, the entire disclosure of which is hereby incorporated by reference in its entirety and for all purposes.

FIELD

The present description relates to power for integrated circuit chips, and in particular to a local cell-level power gating switch.

BACKGROUND

Integrated circuit chips are often provided with low power modes where some or all of the chip can be powered down in order to reduce power consumption and reduce the amount of heat generated by the chip. These modes are referred to as sleep, standby, low power, and by a variety of other names. Multiple core chips may be able to slow down or turn off some cores while other cores continue to operate. For a more complex chip there may be many different sections within a single core that can be switched to a lower voltage or switched to standby. In order to change the power conditions for a section, there is a power gate for the section that controls the power supply. The power gate is operated by a power control section, an instruction manager or software. The control section determines whether a particular section is needed and, if not, then turns it off.

Standard power gating uses a single large switching device providing virtual power to a large section of the logic. The device is switched off during sleep times. During operation, it is switched back on and provides maximum power very quickly. The power must be close to Vcc (for a PMOS (P-type Metal Oxide Semiconductor) switch) or Vss (for an NMOS (N-type Metal Oxide Semiconductor) switch) during operation in order to all of the logic switches to function properly. The single switching device provides power to many different switching sections which present different loads at different times as the different sections are more or less used for the operations. In order to sustain and prevent voltage droops caused by the changing load, the power switches are made large. The interconnect lines between the power switching device and all of the loads are also made large.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein, a local power switch is provided for each logic cell or a larger logic device, such as an integrated circuit chip. Unlike global switches, the local cell-level power switch can be fine-tuned for optimum performance and power consumption. The local level switches may be optimized to improve or even maximize the spatial granularity of the power gating switches. The local switch distributes the impact of ON/OFF events and thereby reduces voltage droops over the system. This prevents potential timing violations. The power consumed by charging and discharging the interconnect lines that connect the power switch is also avoided because these lines remain charged all the way out to the local switch.

Instead of a global switch to provide power to a large logic section, as done in standard power gating techniques, local switches are used herein for each cell. The switches may be vertically integrated with a logic cell using thin-film transistor technologies. This reduces layout area overhead. A local switch provides fine spatial granularity for power gating which provides a better implementation of normally OFF logic.

A local switch also allows the switch to be optimized to provide an optimal power and performance combination for each individual cell. Each local power switch available at the logic cell level may be fine-tuned for the process and power gating requirements of each particular logic cell. This may be done taking into account the power and performance parameters of each individual cell.

A vertically integrated local switch provides a reduction of the interconnect loads that need to be charged and discharged during powering up and powering down. By not having to recharge the interconnects, the power consumption is reduced. As described herein, the logic cells can be selectively switched ON or OFF depending on their activity. This is not possible in standard power gating, where whole sections of logic are switched off based on the activity of the most active paths.

Figure 1:
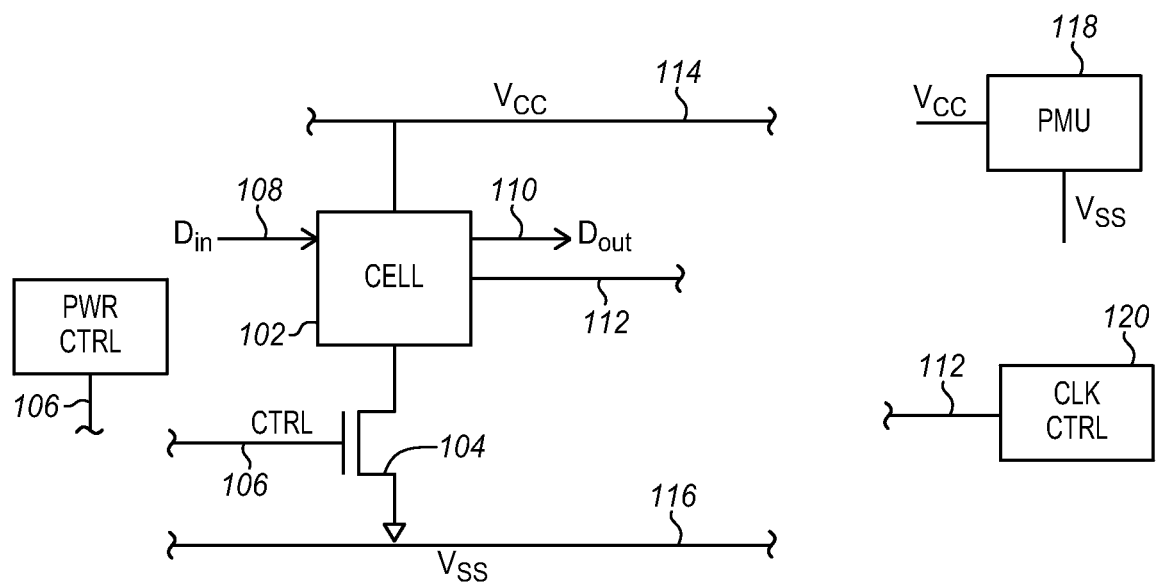
FIG. 1 is a simplified circuit diagram of a logic cell with a local power gate according to an embodiment.

FIG. 1 is a diagram of a logic section with gated power. A logic cell 102 has a data input (Din) line 108 and a data output (Dout) line 110. These inputs and outputs are shown as a single line in order to simplify the drawing. There may be multiple parallel and serial data inputs and outputs. The input may be supplied from a neighboring logic cell or from an interface to an external device. The output, similarly, may be provided to a nearby logic cell or to an interface to an external device.

The logic cell is controlled by a clock input 112. The clock input provides clock pulses to trigger the action of the logic cell to process the inputs and provide outputs. In this way it enables the logic cell by delivering clock pulses and disables the logic cell by not delivering clock pulses. In some embodiments, there is a system clock controller 120 and a clock distribution system that distributes clock signals to all of the logic cells of a logic device, each through a respective clock control signal line 112. The clock may be suspended in order to suspend the operation of any one logic cell. The rate or speed of the clock may also be adjusted to suit different operating conditions. Different logic cells may receive different clock signals at different times to support different operating conditions for the system.

The logic cell is coupled to power supply rails 114, 116 to power its operations. These are indicated as a Vcc power supply input on one side and a Vss power supply output on the other side, although other voltage and power supply types are possible. The power rails are coupled to many other logic cells and eventually to a power management unit (PMU) which provides a regulated power supply input to the entire logic device. A power gate or switch 104 is coupled between the logic cell and one of the power rails. In this case, the power gate is between the logic call and Vss. This is particularly well suited for NMOS (N-type Metal Oxide Semiconductor) logic. However, the power gate may alternatively be between the logic cell and Vcc.

The power gate has a control input 106, such as a gate connector to switch the gate on or off, thereby switching the power to the logic cell on or off. This line receives and is driven by a power control signal, separate and apart from the power rails to control whether power is supplied to the logic cell. The operation of the logic cell is therefore turned on or off based on the power control signal input. The power control signal on this line is supplied by a power controller 122 and allows the power controller to drive each logic cell with a fine-grained and specific local control of the power consumed by each logic cell. In an integrated circuit with many logic cells 102, each logic cell may be controlled independently or the logic cells may be grouped so that, for example, several hundred or thousand cells are switched on or off at the same time.

A large high power gate is normally used on a relatively large logic section that includes many logic cells. A large logic section has variable loads depending on the operating conditions of each cell. The switch is made large enough to account for the maximum possible load when all of the logic cells are operating. The switch will be distant from many of the logic cells and close to the power supply or PMU. As a result the power rails to each logic cell will be long. The power rails are made of many metal lines surrounded by dielectric so that the power rails have an inherent resistance and capacitance. When power is supplied to the power rails, there will be a large load on the power gate for the current required to charge the capacitance of the power rails. Similarly when power is disconnected, the capacitive charge will be dissipated into the device. This results in a significant consumption of power and also results in heating. The capacitance also causes a time delay between when the power is switched on and when full power reaches each logic cell.

With the power switch 104 connected immediately between the logic cell and the power rail, the interconnect is very short. The interconnect through the power rail between the individual power gate 104 and the power supply 118 is still long. However, this interconnect may be powered through all operating conditions of the device. The capacitance of the interconnect will remain charged, but the power will not be supplied to the logic cell until the power gate for that cell is operated. This allows power to be supplied more quickly and eliminates the time required to charge the interconnects. The interconnects are maintained in a charged condition.

Figure 2:
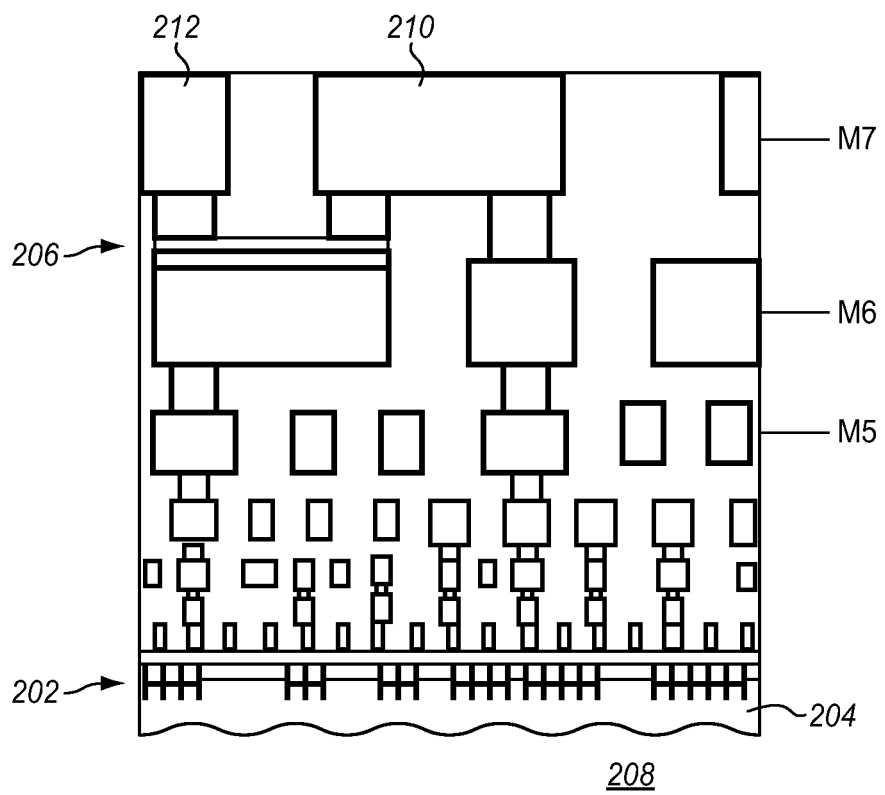
FIG. 2 is a cross-sectional side view diagram of logic circuits and a power gate formed in metal layers in a portion of an integrated circuit according to an embodiment.

The power gate 104 may be constructed by adding a thin film device on upper metal layers of an integrated circuit. FIG. 2 is a cross-sectional diagram of logic circuits 202 in a device layer 204 of a portion of an integrated circuit formed over a substrate 208. Metal layers including layers M5, M6, and M7 are formed over the device layer 204. The power gate may be formed as a back end transistor 206 in any one of the metal layers. The power rails 210 and gate control 212 may be formed in another layer, such as M7 in this example.

By using the upper metal layers, the power gate is formed as a back end transistor (BET) within the same cell layout footprint. The BET may be formed in additional process steps after the transistors of the logic cells have been fabricated but before dicing.

The top switch may be formed over larger cells without affecting cell layout or signal routing. Smaller cells may be spaced apart from each other to accommodate the width of a TFT switch in the upper metal layers.

A local power switch may be provided for each cell. The switch may be integrated vertically so that cell area overhead from the addition of the switch is minimized. The vertically integrated devices may be thin-film transistors (TFT) fabricated on upper interconnect layers. Any of a variety of different thin-film transistor (TFT) types may be used. These types include amorphous Si, low temperature poly-Si, poly-Ge, InGaZnO (IGZO), and transition metal di-chalcogenides. An IGZO (Indium Gallium Zinc Oxide) construction may be used as a semiconducting material to form the channel of a high-performance thin-film transistor. Compared to amorphous silicon, IGZO may have a higher electron mobility which allows the transistor to switch more rapidly.

The IGZO or other type power gate may be integrated on every logic cell. This provides a very fine power gate spatial granularity. The design of the power gate may be optimized for the power demands of each logic cell. The power gate may even be a part of the design of the cell under the control of a cell library. For an IGZO switch, there is very low current leakage so that when the power is off, power consumption and resistive heating is maintained very low. High voltage and fine voltage control are also provided.

The logic cell 102, 202 is one of many logic cells in the integrated circuit chip. The division of the overall logic into different cells may be done in different ways depending on the design and intended use of the logic chip. Integrated circuits are typically designed using a library of cells. Each cell has circuitry for a commonly used component such as a logic device, a flip-flop, a latch, a comparator, an arithmetic unit, a buffer or set of memory registers, a delay gate, or another component. The cells are arranged and ordered on the silicon and then connected together in order to design the desired circuits. The cells may be limited to very simple devices, such as buffers and logic gates or more complex devices such as multipliers and memory arrays, depending on the library.

Each cell in a library is designed to fit within common physical and electrical standards so that the circuit designer is able to lay any cell in any desired location to build the desired circuit. Typically a standard cell size unit is used for all of the cells. Some cells are then designed as being double height or double width or both or some other multiple of the standard size. This allows for more complex components to be combined with simpler components using a single library.

In addition to connections between cells, a cell typically has connections between transistors, diodes, and other components within the cell. These interior connections may be made using metal lines formed over the transistors, diodes, and any other components formed on the silicon substrate of the integrated circuit. The metal lines may be formed in layers such as M1, M2, M3, etc., depending on the library. The power gate may be formed in higher layers above these connections.

Figure 3:
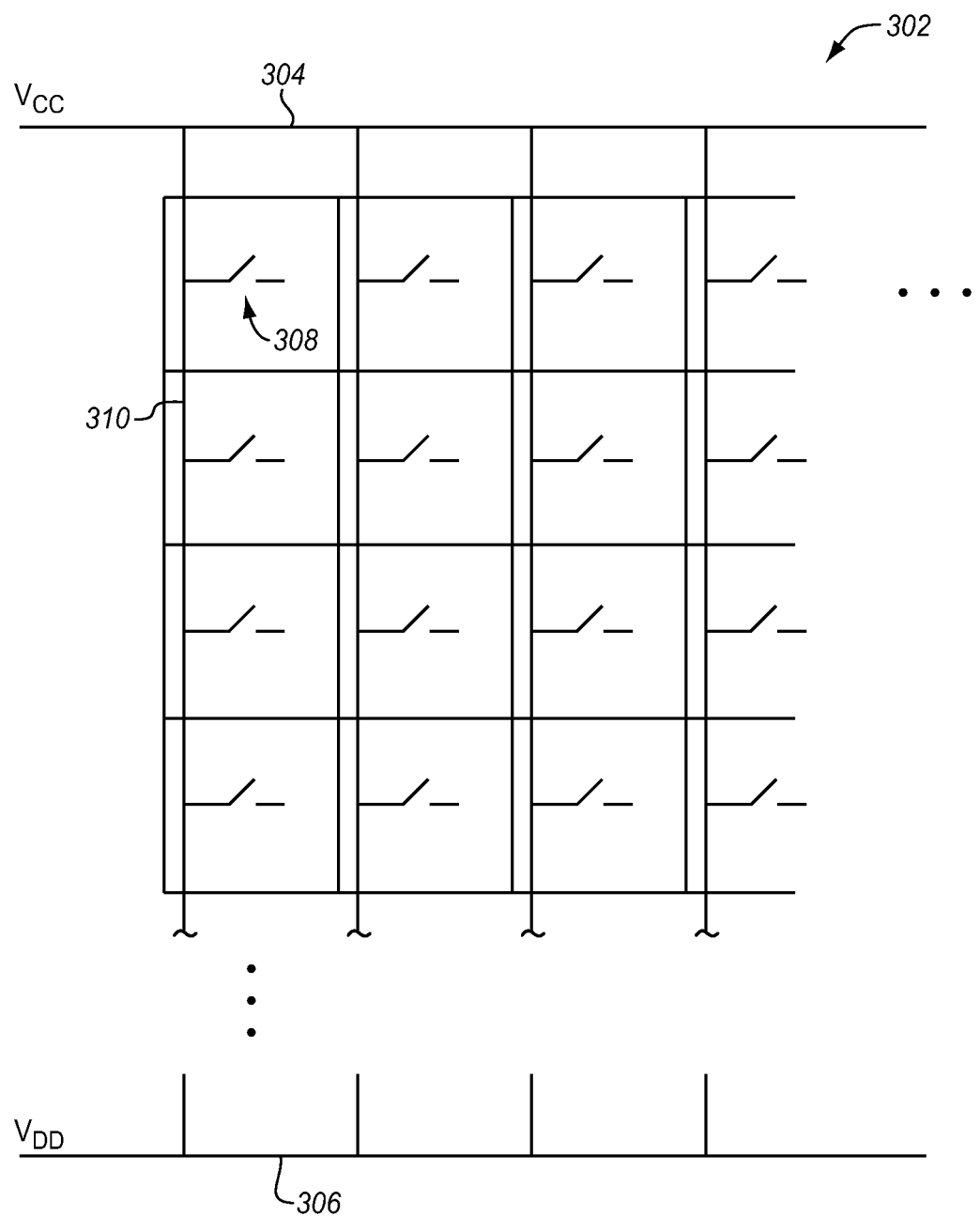
FIG. 3 is a top view diagram of a layout of library cells with local power gates according to an embodiment.

FIG. 3 is a top view diagram of a layout 302 of library cells showing one way in which many cells may be combined to form a larger layout. Only a few cells are shown which may represent a simple integrated circuit. An actual integrated circuit may be about this size or may have thousands or millions of cells depending on the application. In this example, all of the cells are arranged in even rows and columns. However, there may be an offset between the rows, spaces, or management units. There may also be some cells that are larger than other cells. As a result some cells may be horizontally displaced from a cell directly above or below it.

The cells are each coupled between the Vcc 304 and Vdd or Vss 306 power rails. Each cell has a power gate 308 between the power rails to allow or prevent power flow to the cell. As mentioned above, because the power gate is a single device designed for less leakage than the circuit elements of the logic cell, total leakage is greatly reduced through the logic cell by switching off the power gate. The power gate is connected to the voltage rails through interconnects 310 which also have very low leakage. By turning off a power gate when power is not needed at a particular cell, the total leakage current may be greatly reduced. Each cell may be independently controlled or some small number of cells may be grouped and controlled together using a local switch at each cell. The cells shown in this and all of the other diagrams may correspond to transistors, to tri-gate devices, to logic gates, or to a wide range of other logic and semiconductor devices and assemblies.

Figure 4:
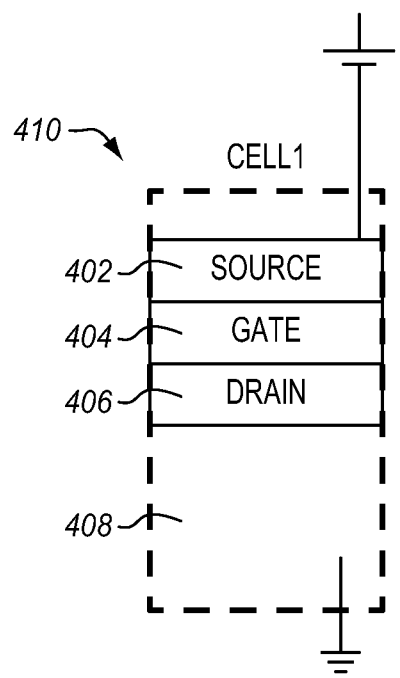
FIG. 4 is a side view diagram of a normal cell with a power gate and logic circuit according to an embodiment.
Figure 5:
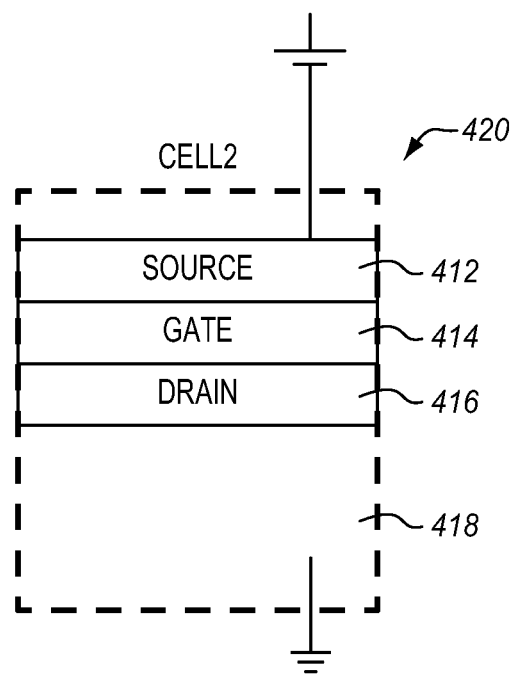
FIG. 5 is a side view diagram of an enlarged cell with a power gate and logic circuit according to an embodiment.
Figure 6:
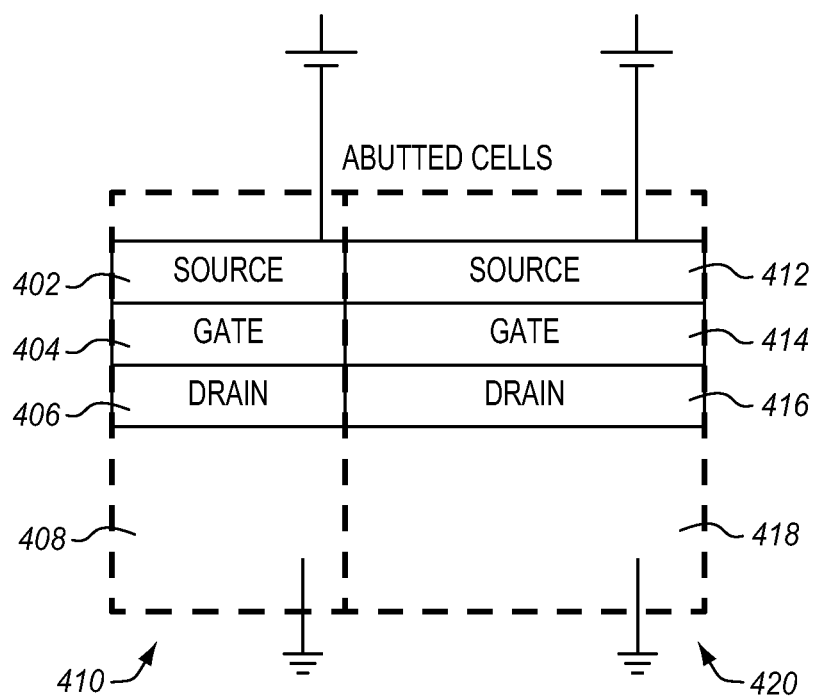
FIG. 6 is a side view diagram of the cells of FIGS. 4 and 5 abutted according to an embodiment.

FIGS. 4-6 are cross-sectional simplified side view diagram of power gates over logic cells to show how combinations may be formed. FIG. 4 corresponds to a simple power gate and logic cell 410 as described above. It includes a source 402 coupled to Vcc or another power source, a gate 404 controlled by a power control system, and a drain 406 to supply power to a logic cell 408. FIG. 5 shows a similar structure for a second cell 420 with a power gate that includes a source 412 coupled to Vcc or another power source, a gate 414 controlled by a power control system, and a drain 416 to supply power to a logic cell 418. As shown, the dimensions of the second logic cell are larger than those of the first logic cell. The sizes of the switches may be adapted to suit the power demands of each cell using the metal layers. A logic cell that consumes more power may, accordingly, have a larger power switch regardless of the physical size of the logic switch.

FIG. 6 shows a variation in which the two adjacent cells 410, 420 abut one another. The power switches may be laid out such that when two adjacent cells are abutted side-by-side, a single, double size, large device is formed and able to provide sufficient drive current for the shared logic below with minimal power droop. The combined double power switch has a larger combined source gate and drain. This switch may be configured to be large enough to provide enough current to drive both of the logic cells 408, 418 below. More than two power gates may be combined to suit particular implementations. In many embodiments, the cells are triggered sequentially. The triggering may be from a clock circuit or as a result of the passing of data sequentially from one cell to the next. As a result, only one cell in the chain is drawing power at a given time. This allows for the switch to be made smaller.

In some embodiments, the cell library may be designed with two types of cells. A first type includes the local power switch as described above. As described, the local power switch may be fabricated within and including parts of the metal layers above the logic circuits. The second type of cell does not include the local power switch. This allows the location and size of the power switch to be designed later for optimum placement and performance.

Figure 7:
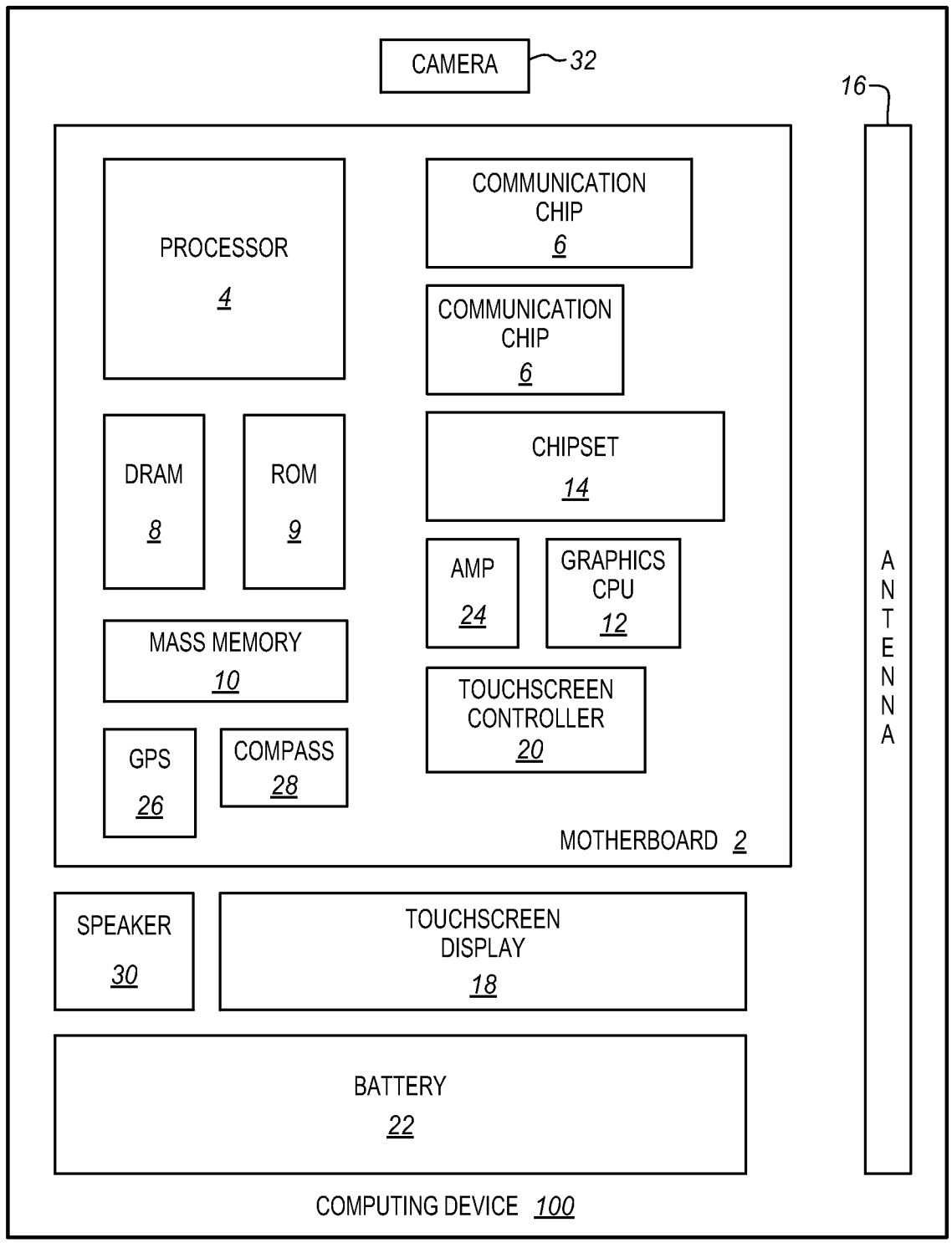
FIG. 7 is a block diagram of a computing device incorporating an integrated circuit chip with local power gates according to an embodiment.

FIG. 7 illustrates a computing device 11 in accordance with one implementation. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 11 includes at least one packaged integrated circuit die. In some implementations, the integrated circuit die of the processor, memory devices, communication devices, or other components are designed and laid out using cells from a library as described herein. Any one of these components may also include local power gates over some of the logic cells as described herein. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a plurality of logic cells of an integrated circuit die, each logic cell having a data input line and a data output line and a power supply input to receive power to drive circuits of the logic cell, and a power switch for each logic cell coupled between a power supply and the power supply input of the respective logic cell to control power being connected from the power supply to the respective logic cell.

Further embodiments include a plurality of power control signal lines each connected to a respective power switch to control the operation of the respective switch.

Further embodiments include a plurality of clock control signal lines each connected to a respective logic cell to enable and disable the clock of the respective logic cell and wherein the power control signal lines are each driven by a respective clock control signal line.

In further embodiments the power switches are back end transistors formed in an interconnect layer of the die over the respective logic cell.

In further embodiments the interconnect layers comprise metal layers.

In further embodiments the back end transistor has an indium gallium zinc oxide construction.

In further embodiments the back end transistor is vertically integrated.

In further embodiments the plurality of logic cells are logic cells of an integrated circuit design library.

In further embodiments the logic cells of the library include the respective power switch.

In further embodiments two of the plurality of logic cells are adjacent to and abut one another and wherein the respective power switches for the two logic cells are combined to both control power to the two logic cells.

In further embodiments each power switch is coupled between a power rail from the power supply and the power supply input of the respective logic cell.

Some embodiments pertain to an apparatus that includes a logic cell of an integrated circuit die formed in an active layer over a die substrate, the logic cell having a data input line and a data output line and a power supply input to receive power to drive circuits of the logic cell, and a power switch formed in a metal layer over the active layer and over the die substrate coupled between a power supply rail and the power supply input of the logic cell to control power being connected from the power supply to the logic cell.

Further embodiments include a clock control signal line connected to the logic cell to enable and disable the clock of the logic cell and wherein the power control signal line is driven by the clock control signal line.

In further embodiments the power switch is a back end transistor and the metal layer is an interconnect layer of the die over the respective logic cell.

In further embodiments the back end transistor is vertically integrated.

Further embodiments include a second logic cell adjacent to and abutting the first logic cell and having a power supply input coupled to the power switch.

Some embodiments pertain to a computing device that includes a board, a power supply coupled to the board, and an integrated circuit die connected to the power supply through the board, the integrated circuit die having a plurality of logic cells, each logic cell having a data input line and a data output line and a power supply input to receive power to drive circuits of the logic cell, and a power switch for each logic cell coupled between a power supply and the power supply input of the respective logic cell to control power being connected from the power supply to the respective logic cell.

Further embodiments include a plurality of power control signal lines each connected to a respective power switch to control the operation of the respective switch.

In further embodiments the power switches are back end transistors formed in an interconnect layer of the die over the respective logic cell.

In further embodiments each power switch is coupled between a power rail from the power supply and the power supply input of the respective logic cell.

The invention claimed is:

1. An apparatus comprising:
a plurality of logic cells of an integrated circuit die, each logic cell having a data input line and a data output line and a power supply input to receive power to drive circuits of the logic cell; and
a power switch for each logic cell coupled between a power supply and the power supply input of the respective logic cell to control power being connected from the power supply to the respective logic cell, wherein the power switch switches between allowing or preventing power flow to the respective logic cell, wherein the power switch is a back end transistor formed in one or more interconnect layers of the integrated circuit die over the respective logic cell, and wherein the power switch is vertically integrated within a cell layout footprint of the respective logic cell.

2. The apparatus of claim 1, further comprising a plurality of power control signal lines each connected to a respective power switch to control the operation of the respective switch.

3. The apparatus of claim 2, further comprising a plurality of clock control signal lines each connected to a respective logic cell to enable and disable the clock of the respective logic cell and wherein the power control signal lines are each driven by a respective clock control signal line.

4. The apparatus of claim 1, wherein the interconnect layers comprise metal layers.

5. The apparatus of claim 1, wherein the back end transistor has an indium gallium zinc oxide construction.

6. The apparatus of claim 1, wherein the plurality of logic cells are logic cells of an integrated circuit design library.

7. The apparatus of claim 6, wherein the logic cells of the library include the respective power switch.

8. The apparatus of claim 1, wherein two of the plurality of logic cells are adjacent to and abut one another and wherein the respective power switches for the two logic cells are combined to both control power to the two logic cells.

9. The apparatus of claim 1, wherein each power switch is coupled between a power rail from the power supply and the power supply input of the respective logic cell.

10. An apparatus comprising:
a logic cell of an integrated circuit die formed in an active layer over a die substrate, the logic cell having a data input line and a data output line and a power supply input to receive power to drive circuits of the logic cell; and
a power switch formed over the active layer and over the die substrate coupled between a power supply rail and the power supply input of the logic cell to control power being connected from the power supply to the logic cell, wherein the power switch switches between allowing or preventing power flow to the logic cell, wherein the power switch is a back end transistor formed in one or more interconnect layers of the integrated circuit die over the respective logic cell, and wherein the power switch is vertically integrated within a cell layout footprint of the logic cell.

11. The apparatus of claim 10, further comprising a clock control signal line connected to the logic cell to enable and disable the clock of the logic cell and wherein the power control signal line is driven by the clock control signal line.

12. The apparatus of claim 10, further comprising a second logic cell adjacent to and abutting the first logic cell and having a power supply input coupled to the power switch.

13. A computing device comprising:
a board;
a power supply coupled to the board; and
an integrated circuit die connected to the power supply through the board, the integrated circuit die having a plurality of logic cells, each logic cell having a data input line and a data output line and a power supply input to receive power to drive circuits of the logic cell, and a power switch for each logic cell coupled between a power supply and the power supply input of the respective logic cell to control power being connected from the power supply to the respective logic cell, wherein the power switch switches between allowing or preventing power flow to the respective logic cell, wherein the power switch is a back end transistor formed in one or more interconnect layers of the integrated circuit die over the respective logic cell, and wherein the power switch is vertically integrated within a cell layout footprint of the respective logic cell.

14. The computing device of claim 13, further comprising a plurality of power control signal lines each connected to a respective power switch to control the operation of the respective switch.

15. The computing device of claim 13, wherein each power switch is coupled between a power rail from the power supply and the power supply input of the respective logic cell.

* * * * *